(12) United States Patent
Chang

(10) Patent No.: US 7,760,840 B2
(45) Date of Patent: Jul. 20, 2010

(54) CLOCK-SIGNAL ADJUSTING METHOD AND DEVICE

(75) Inventor: Chi Chang, Taipei (TW)

(73) Assignee: Via Technologies, Inc., Taipei (TW)

( * ) Notice: Subject to any disclaimer, the term of this patent is extended or adjusted under 35 U.S.C. 154(b) by 971 days.

(21) Appl. No.: 11/464,756

(22) Filed: Aug. 15, 2006

(65) Prior Publication Data

US 2007/0041485 A1    Feb. 22, 2007

Related U.S. Application Data

(60) Provisional application No. 60/709,932, filed on Aug. 19, 2005.

(51) Int. Cl.
*H03D 3/24* (2006.01)
(52) U.S. Cl. ...................................... 375/376
(58) Field of Classification Search ................ 375/226, 375/371, 373–376, 355; 370/503, 516; 327/144, 327/147, 156
See application file for complete search history.

(56) References Cited

U.S. PATENT DOCUMENTS 5,172,395 A * 12/1992 Dapper et al. ................ 375/346
5,842,001 A    11/1998 Kubota
6,075,416 A *  6/2000 Dalmia ......................... 331/25
6,215,835 B1   4/2001 Kyles
6,389,090 B2   5/2002 Zortea et al.
6,683,930 B1   1/2004 Dalmia
7,321,647 B2 * 1/2008 Matsuura ..................... 375/355
2002/0190765 A1   12/2002 Matsunami et al.
2003/0190006 A1 * 10/2003 Nagano ....................... 375/376
2004/0196937 A1   10/2004 Wang et al.
2005/0265440 A1 * 12/2005 Sohn ........................... 375/233
2006/0109942 A1 *  5/2006 Vallet .......................... 375/355

* cited by examiner

*Primary Examiner*—Khanh C Tran
(74) *Attorney, Agent, or Firm*—Kirton & McConkie; Evan R. Witt

(57) ABSTRACT

A clock-signal adjusting method and device is used for adjusting a frequency of a clock signal according to a frequency of an input data. The input data is sampled with a sampling frequency m times of the clock frequency to obtain a data transition waveform indicating data transition timing distribution. A unitary bit time of the input data is divided into m zones. A frequency relationship between the clock signal and the input data is determined according to a shift of the data transition waveform relative to the zones. The frequency of the clock signal is adjusted according to the frequency relationship.

20 Claims, 8 Drawing Sheets

CLOCK-SIGNAL ADJUSTING METHOD AND DEVICE

CROSS REFERENCE TO RELATED PATENT APPLICATION

This patent application claims the benefit of U.S. provisional patent application No. 60/709,932, filed Aug. 19, 2005.

FIELD OF THE INVENTION

The present invention relates to clock-signal adjusting method and device, and more particularly to clock-signal adjusting method and device for adjusting a local reference clock according to a serial input data.

BACKGROUND OF THE INVENTION

The implementation of CDR (Clock Data Recovery) is a key to high speed I/O interfaces such as high speed asynchronous serial buses. FIG. 1 is a functional block diagram illustrating a portion of a Phase Locked Loop (PLL) based CDR circuit. The circuit shown in FIG. 1 includes a phase/frequency detector 11 which, in a frequency mode, outputs an up/down pulse signal according to the phase/frequency difference between a local reference clock ref-clock and a clock signal Ck generated by a voltage controlled oscillator (VCO) 16. When the frequency of the local reference clock ref-clock is higher than that of the clock signal Ck, an up pulse signal is outputted by the phase/frequency detector 11. On the contrary, if the frequency of the local reference clock is lower than that of the clock signal Ck, a down pulse signal is outputted. The up/down pulse signal is then processed by a charge pump 14 and a loop filter 15 and inputted to the VCO 16 as a control voltage of the last order VCO 16. Accordingly, the frequency of the clock signal Ck outputted by the VCO 16 can be adjusted to approximate to the frequency of the local reference clock ref-clock. With the feedback of the resulting clock signal Ck to the phase/frequency detector 11, the frequency of the clock signal Ck can approximate to the local reference clock ref-clock to a certain extent, and then the multiplexer 13 is switched into a phase mode to have the received data Rdata sampled with the adjusted clock signal Ck.

The CDR circuit further includes a phase detector 12 for detecting the phase difference between the received data Rdata and the adjusted clock signal Ck as it is infeasible to define a sampling frequency according to the waveform of the high speed asynchronous serial data Rdata. The phase difference is then referred to adjust the phase of the clock signal Ck, thereby stably locking data for data recovery. However, the differentiation of the frequencies of the data Rdata and the reference clock signal would be inevitable or unpredictable if different clock sources are used in respective interfaces or low frequency power/ground noises occur between interfaces. If the frequency difference is beyond a certain level, there would be problem in locking data in the phase mode. Generally, a minor data-locking problem can be solved by accelerating the response of the PLL circuit. However, the data-locking problem resulting from significant frequency difference cannot be simply solved in this way because the ability of the conventional phase detector to track the frequency variation is limited.

SUMMARY OF THE INVENTION

An embodiment of a clock-signal adjusting method for adjusting a frequency of a clock signal according to a frequency of an input data. The input data is sampled with a sampling frequency m times of the clock frequency to obtain a data transition waveform indicating data transition timing distribution. A unitary bit time of the input data into m zones. A frequency relationship between the clock signal and the input data is determined according to a shift of the data transition waveform relative to the zones. The frequency of the clock signal is adjusted according to the frequency relationship.

Another embodiment of a clock-signal adjusting device for adjusting a frequency of a clock signal according to a frequency of an input data. In the clock-adjusting device, a first oversampling circuit is used for receiving and sampling the input data with a sampling frequency m times of the frequency of the clock signal to obtain a first data transition waveform indicating a first data transition timing distribution. A first flip-flop is coupled to the first oversampling circuit for receiving and sampling the first data transition waveform with the frequency of the clock signal. A logic judging circuit is coupled to the first flip-flop for determining a first shift of the first data transition waveform according to the input and output of the first flip-flop, and outputs a control signal for adjusting the frequency of the clock signal according to the first shift.

A further embodiment of a clock-signal adjusting device for adjusting a clock signal according to an input data and a reference clock signal. In the clock-adjusting device, a phase lock loop body outputs the clock signal, a phase/frequency detector is coupled to the phase locked loop circuit and issues a first adjusting signal according to a frequency difference between the reference clock signal and the clock signal, a data frequency detector is coupled to the phase locked loop circuit and issues a second adjusting signal according to a frequency difference of the input data and the clock signal, a phase detector is coupled to the phase locked loop circuit and issues a third adjusting signal according to a phase difference of the input data and the clock signal, a first multiplexer is coupled to the phase/frequency detector and the phase detector to select one of the first adjusting signal and the third adjusting signal to be outputted, and a second multiplexer is coupled to the first multiplexer and the data frequency detector to select one of an output of the first multiplexer and the second adjusting signal to be outputted to the phase locked loop circuit for adjusting and then outputting the clock signal.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
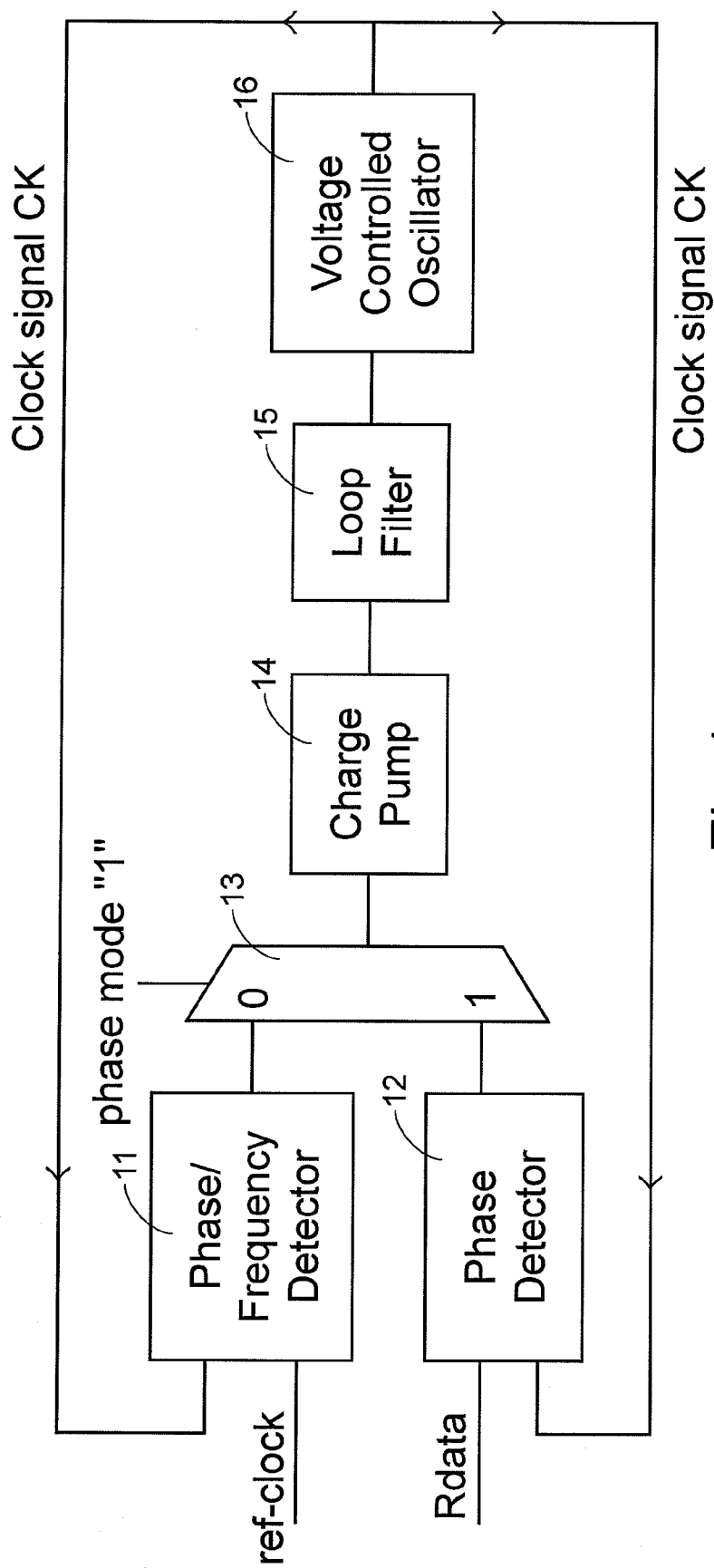
FIG. 1 is a functional block diagram illustrating a conventional clock-signal adjusting device used in a CDR circuit.
Figure 2:
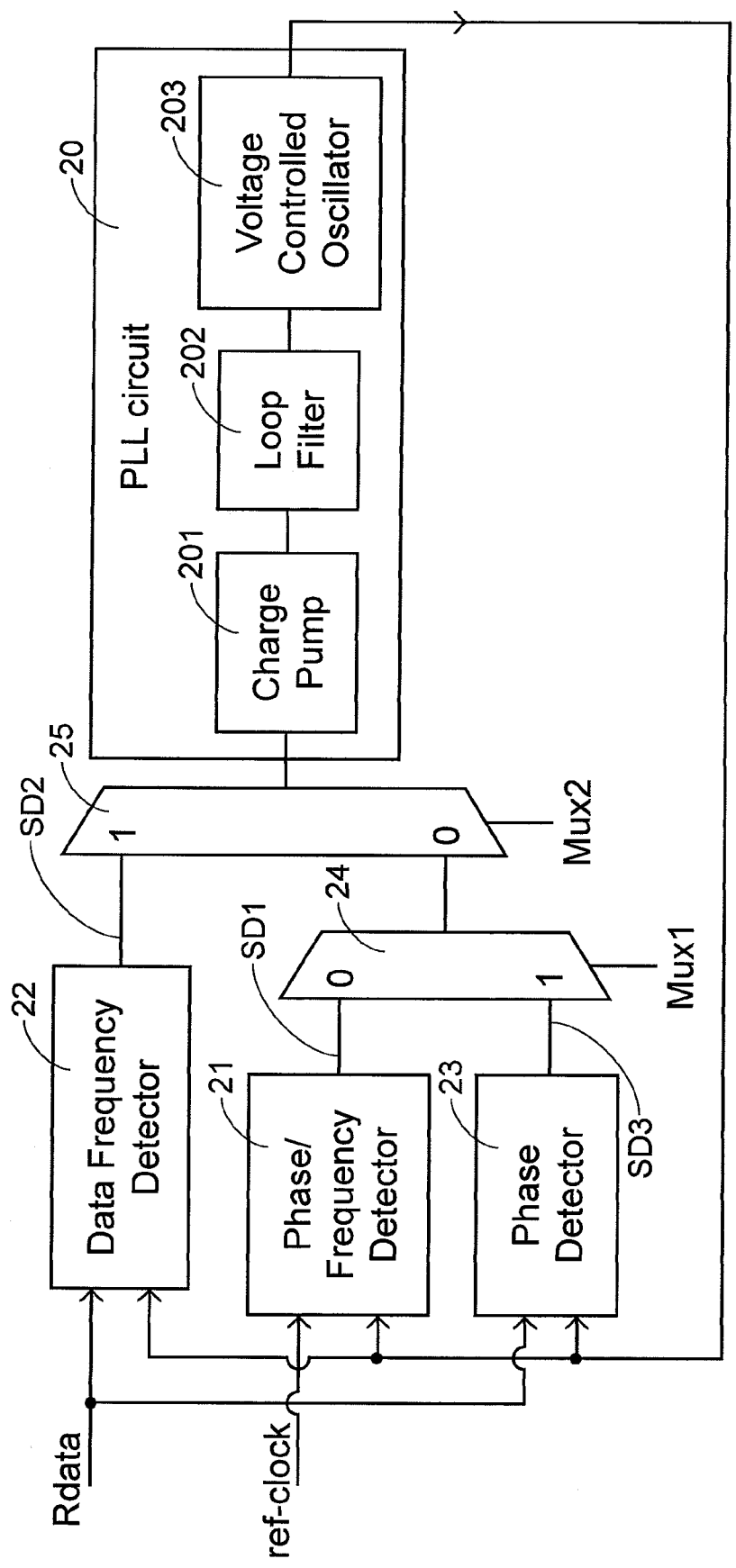
FIG. 2 is a functional block diagram illustrating a clock-signal adjusting device according to an embodiment of the invention.

A clock-signal adjusting device according to an embodiment of the invention includes a PLL circuit 20, a phase/frequency detector 21, a data frequency detector 22, a phase detector 23, a first multiplexer 24 and a second multiplexer 25, as illustrated in FIG. 2.

For adjusting both the frequency and phase of a clock signal Ck generated by the PLL circuit 20, a series of mode transitions are involved. First of all, the system enters a first mode. In the first mode, a first adjusting signal SD1 is generated by the phase/frequency detector 21 according to the frequency difference between a local reference clock ref-clock and the clock signal Ck. The frequency of the clock signal Ck less than that of the local reference clock ref-clock is increased in response to the first adjusting signal SD1, while the frequency of the clock signal Ck greater than that of the local reference clock is decreased. By repetitive feedback and adjustment of the clock signal Ck, the frequency of the clock signal Ck is approximated to that of the local reference clock ref-clock.

Once the frequency difference between the clock signal Ck and the local reference clock ref-clock is reduced to a threshold, the system is switched from the first mode to a second mode. In the second mode, the data frequency detector 22 detects the frequency difference between the serial input data Rdata and the previously adjusted clock signal Ck. Then, a second adjusting signal SD2 is generated according to the frequency difference. By repetitive feedback and adjustment of the clock signal Ck, the frequency of the clock-signal Ck is approximated to that of the serial input data Rdata, i.e. the data transferring rate, and the frequency difference between the data Rdata and the reference clock ref-clock can be eliminated.

Afterwards, the system is switched again from the second mode to a third mode, and the phase detector 23 outputs a third adjusting signal SD3 according to the phase difference between the serial input data Rdata and the clock signal Ck. The frequency- and phase-adjusted clock signal Ck is then used for data recovery of the serial input data Rdata.

Figure 3:
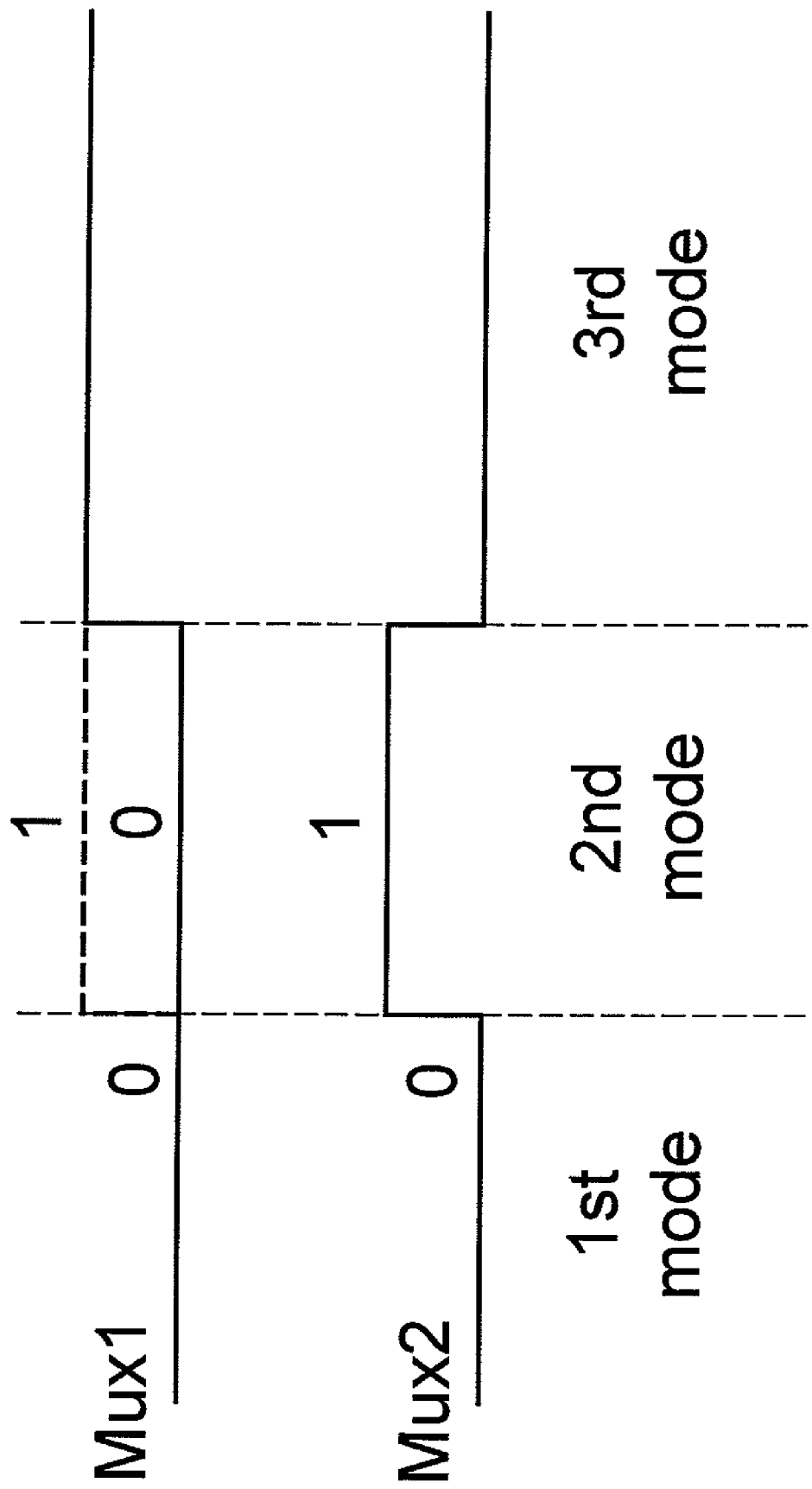
FIG. 3 is a waveform diagram illustrating the operations of the first and second multiplexers used in the clock-signal adjusting device of FIG. 2.

The first mode, the second mode and the third mode are selected by the control signals Mux1 and Mux2 inputted to the first multiplexer 24 and the second multiplexer 25. The switching of control signals Mux1 and Mux2 of the first multiplexer 24 and the second multiplexer 25 are illustrated in FIG. 3. When the system is in the first mode, both the control signals Mux1 and Mux2 are at logic "0". When the control signal Mux2 is changed to logic "1", the system is in the second mode (the control signal Mux1 could be logic "0" or "1"). Furthermore, when the control signals Mux1 and Mux2 are at logics "1" and "0", respectively, it is indicated that the system is in the third mode.

The data frequency detector 22 plays a very important role in reducing the frequency difference between the clock signal Ck and the serial input data Rdata by adjusting the frequency of the clock signal Ck outputted by the PLL circuit 20. The data frequency detector 22 outputs the second adjusting signal DS2 according to the frequency difference between the clock signal Ck and the serial input data Rdata. In response to the second adjusting signal SD2, the frequency of the clock signal Ck higher than that of the serial input data Rdata is reduced, and the frequency of the clock signal Ck lower than that of the Rdata is increased. Accordingly, the frequency of the clock signal Ck is approximated to that of the Rdata.

Figure 4:
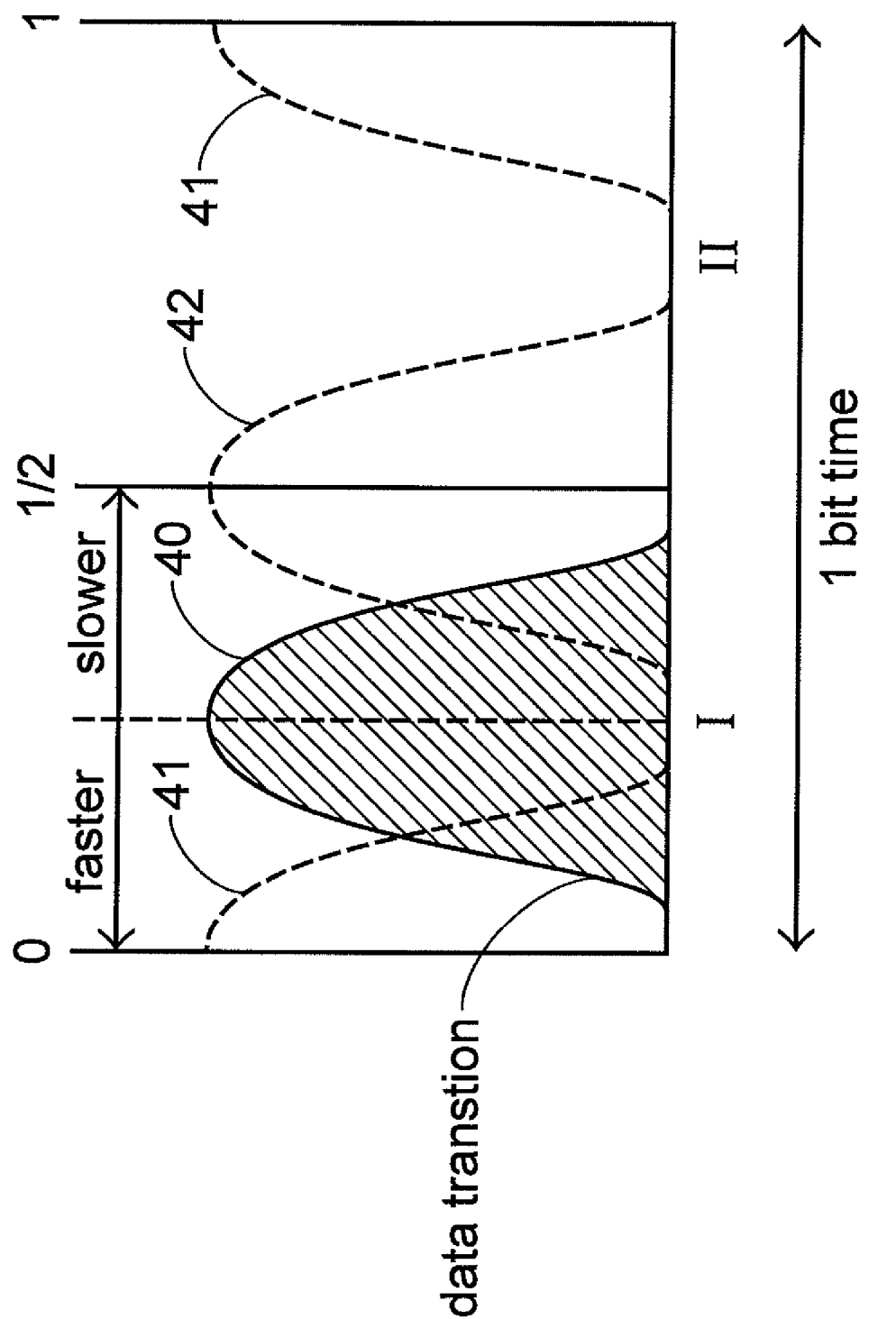
FIG. 4 is a waveform diagram illustrating possible distributions and variations of data transition timing resulting from a first embodiment of a clock-adjusting method according to the invention.

A clock adjusting method according to a first embodiment of the present invention is illustrated hereinafter with reference to FIG. 4. In this method, a double frequency sampling is performed on the serial input data Rdata, i.e. sampling the data Rdata with twice frequency of the clock signal Ck, thereby realizing possible distribution of data transition timing as shown in FIG. 4. For facilitating the analysis, a unitary bit time of the serial input data Rdata is divided into two zones, and the data transition waveform obtained by sampling with double frequency is supposed to be located in Zone I instead of Zone II. However, when there is frequency difference existing between the serial input data Rdata and the clock signal Ck, the waveform shifts, either leftwards or rightwards. Accordingly, whether there is frequency difference between the serial input data Rdata and the clock signal Ck can be determined by observing whether there is waveform shift occurring, and which of the serial input data Rdata and the clock signal Ck has a higher frequency can also be determined by observing the shift direction of the data transition waveform. For example, the waveform 40 indicates a normal distribution when there is no frequency difference occurring; the waveform 41 resulting from the leftward shift of the waveform 40 indicates the serial input data Rdata is faster than the clock signal Ck; and the waveform 42 resulting from the rightward shift of the waveform 40 indicates the serial input data Rdata is slower than the clock signal Ck As described above, the frequency difference can be figured out according to the present method if the waveforms 41 and 42 that both partially shift into Zone II can be identified.

Figure 5:
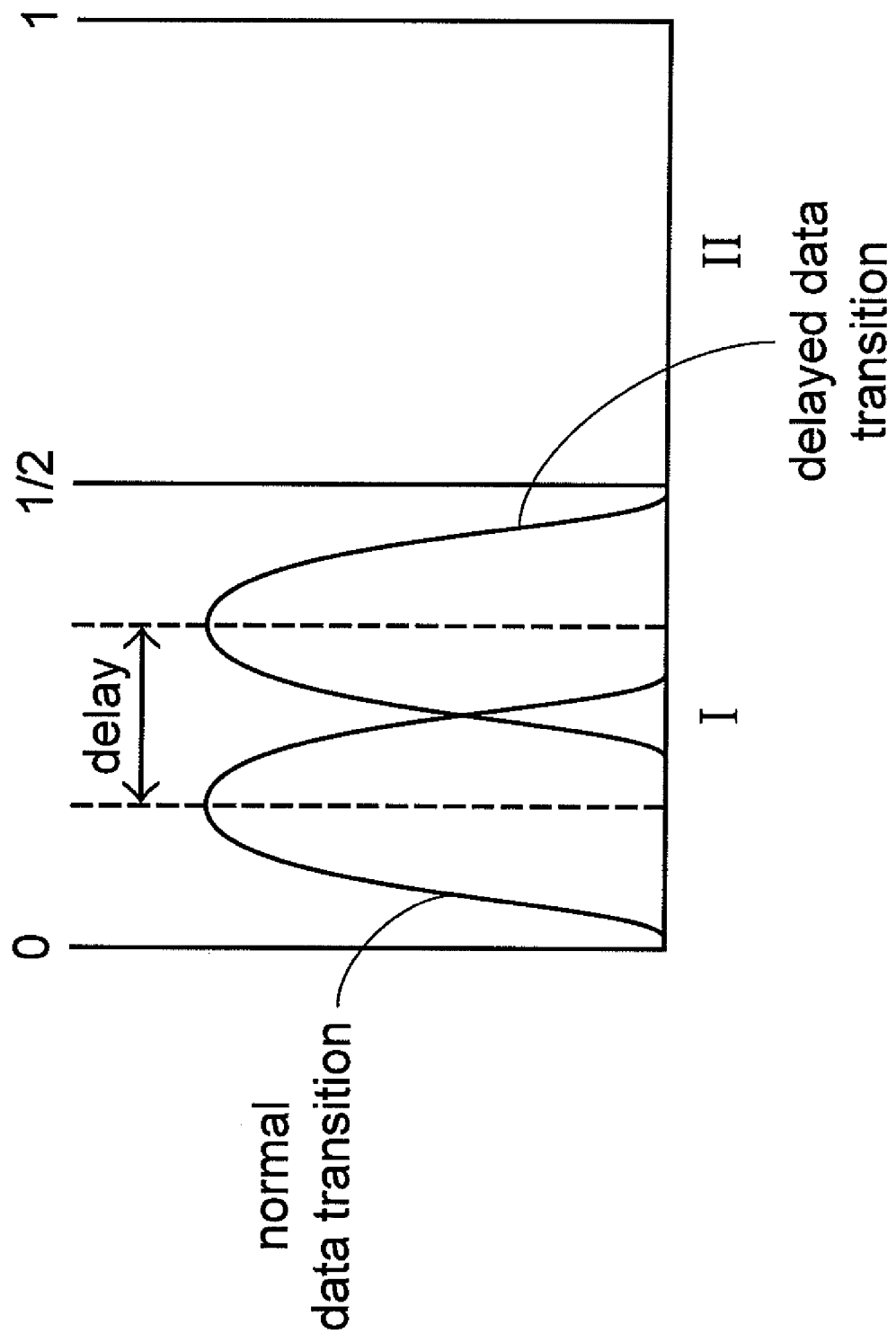
FIG. 5 is a waveform diagram illustrating possible distributions and variations of data transition timing resulting from a second embodiment of a clock-adjusting method according to the invention.

An Example for distinguishing leftward shift or rightward shift of data transition waveform after a double frequency sampling operation will be illustrated hereinafter as another embodiment of a clock adjusting method according to the present invention. By delaying the data transition waveform and observing how the delayed waveform differs from the expectation, the frequency difference between the serial input data Rdata and the clock signal Ck can be inferred. Please refer to FIG. 5 and Table 1. When the serial input data Rdata (waveform 50) is delayed for a certain period to shift from Zone I to Zone II but the delayed waveform 51 is found to remain in Zone I, it can be inferred that the serial input data is faster than the clock signal Ck, i.e. the frequency of the serial input data is higher than that of the clock signal Ck. On the contrary, when the serial input data Rdata is delayed for a less significant period remaining the waveform still located in Zone I, but the shift of the delayed waveform from Zone I to Zone II is observed, it can be inferred that the serial input data is slower than the clock signal Ck, i.e. the frequency of the serial input data is lower than that of the clock signal Ck. Likewise, when the serial input data Rdata is delayed for a certain period to shift from Zone II to Zone I but the delayed waveform is found to remain in Zone II, it can be inferred that the serial input data is faster than the clock signal Ck, i.e. the frequency of the serial input data is higher than that of the clock signal Ck. On the contrary, when the serial input data Rdata is delayed for a less significant period remaining the waveform still located in Zone II, but the shift of the delayed waveform from Zone II to Zone I is observed, it can be inferred that the serial input data is slower than the clock signal Ck, i.e. the frequency of the serial input data is lower than that of the clock signal Ck.

TABLE 1

| The way the normal data transition waveform is delayed | The result the delayed data transition waveform is observed | Frequency order |
| --- | --- | --- |
| From Zone I to Zone II | Remain in Zone I | Rdata > Ck |
| Remain in Zone I | From Zone I to Zone II | Rdata < Ck |
| From Zone II to Zone I | Remain in Zone II | Rdata > Ck |
| Remain in Zone II | From Zone II to Zone I | Rdata < Ck |

Figure 6:
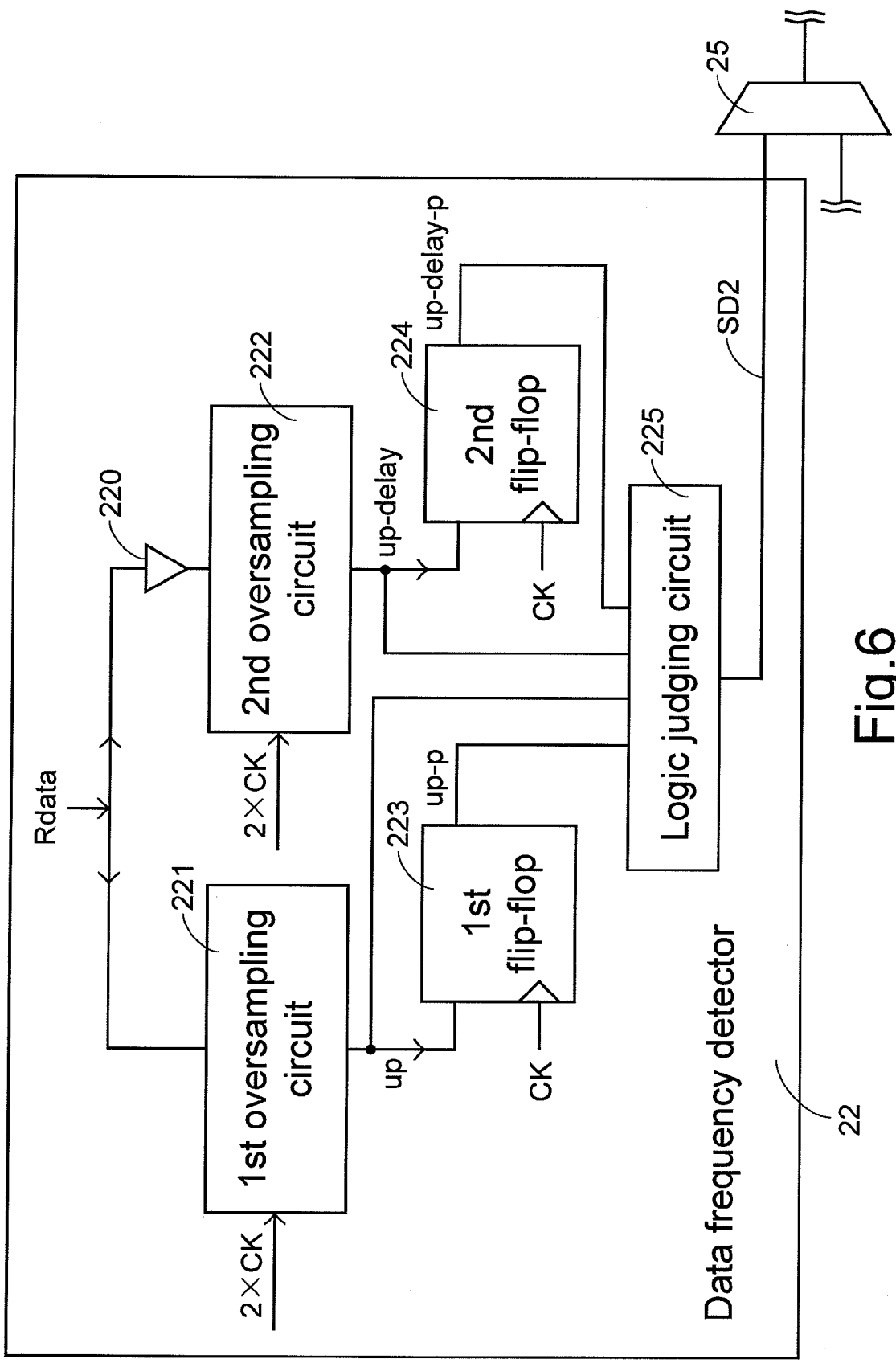
FIG. 6 is a functional block diagram illustrating an embodiment of data frequency detector for use in the clock-signal adjusting device of FIG. 2 to implement the clock-signal adjusting method of FIG. 5.

For implementing the above clock adjusting method, an embodiment of data frequency detector 22 is provided as shown in FIG. 6. The data frequency detector 22 includes a delay unit 220, a first oversampling circuit 221 and a second oversampling circuit 222, a first flip-flop 223, a second flip-flop 224, and a logic judging circuit 225. The delay unit 220 receives and delays the output of the serial input data Rdata for a predetermined period. The predetermined period is selected to be able to showing the process of Table 1, which is preferably shorter than a unitary bit time of the serial input data Rdata, e.g. ¼ bit time. The first oversampling circuit 221 and the second oversampling circuit 222 respectively receive and sample the serial input Rdata and the delayed serial input data Rdata_delay with a sampling frequency twice that of the clock signal Ck to obtain a data transition waveform in response to a series of sampling data points. When it is found by any of the oversampling circuits 221 and 222 that there are more data transition points located in Zone I than in Zone II, a first value (e.g. logic "1") is outputted to indicate that the distribution waveform of the serial input data Rdata or the delayed data Rdata_delay is located in Zone I. On the contrary, a second value (e.g. logic "0") is outputted when more data transition points are located in Zone II to represent that the distribution waveform of the serial input data Rdata or the delayed data Rdata_delay is located in Zone II. Furthermore, the first flip-flop 223 electrically connected to the first oversampling circuit 221 and the second flip-flop 223 electrically connected to the second oversampling circuit 222 respectively receive the first value and the second value and output the values after a unitary bit-time delay. Afterwards, the logic judging circuit 225 outputs the second adjusting signal SD2 to the multiplexer 25 (FIG. 2) according to the outputs of the first oversampling circuit 221, the second oversampling circuit 222, the first flip-flop 223 and the second flip-flop 224. A truth table of the output SD2 of the logic judging circuit 225 is shown in Table 2.

TABLE 2

| up | up-p | up-delay | up-delay-p | SD2 |
| --- | --- | --- | --- | --- |
| 1 | 0 | 1 | 1 | 1 |
| 0 | 1 | 0 | 0 | 1 |
| 1 | 1 | 1 | 0 | 0 |
| 0 | 0 | 0 | 1 | 0 |

The references up, up-p, up-delay, and up-delay-p respectively represent the outputs of the first oversampling circuit 221, the second oversampling circuit 222, the first flip-flop 223 and the second flip-flop 224. The logic value "1" represents that the majority of the distribution waveform is located in Zone I, while the logic value "0" represents that the majority of the distribution waveform is located in Zone II. Accordingly, the logic judging circuit 225 can judge the order of the frequencies of the serial input data Rdata and the clock-signal Ck. For example, if the logic values of the input "up" and the output "up-p" of the flip-flop 223 are "1" and "0", respectively, it means the data transition waveform is supposed to shift from Zone I to Zone II. Meanwhile, if the logic values of the input "up-delay" and the output "up-delay-p" of the flip-flop 224 are both "1", it means the delayed data transition waveform remains in Zone I. Accordingly, that the frequency of the serial input data Rdata is higher than that of the clock signal Ck can be determined, and then logic "1" is outputted by the logic judging circuit 225 as the adjusting signal SD2 according to the truth table of Table 2. Likewise, if the logic values of the input "up" and the output "up-p" of the flip-flop 223 and the input "up-delay" and the output "up-delay-p" of the flip-flop 224 are "0", "1", "0" and "0", respectively, the output "SD2" of the logic judging circuit 225 will be "1". This means when the data transition waveform shifts from Zone II to Zone I but the delayed data transition waveform remains in Zone I, the frequency of the serial input data Rdata is determined to be higher than that of the clock signal Ck. If the logic values of the input "up" and the output "up-p" of the flip-flop 223 and the input "up-delay" and the output "up-delay-p" of the flip-flop 224 are "1", "1", "1" and "0", respectively, the output "SD2" of the logic judging circuit 225 will be "0". This means when the data transition waveform remains in Zone I but the delayed data transition waveform shifts from Zone I to Zone II, the frequency of the serial input data Rdata is determined to be lower than that of the clock signal Ck. If the logic values of the input "up" and the output "up-p" of the flip-flop 223 and the input "up-delay" and the output "up-delay-p" of the flip-flop 224 are "0", "0", "0" and "1", respectively, the output "SD2" of the logic judging circuit 225 will be "0". This means when the data transition waveform remains in Zone II but the delayed data transition waveform shifts from Zone II to Zone I, the frequency of the serial input data Rdata is determined to be lower than that of the clock signal Ck. In response to the logic "1" of the adjusting signal SD2 inputted to the multiplexer 25 of FIG. 2, the frequency of the clock signal Ck is increased, while the frequency of the clock signal Ck will be reduced in response to the logic "0" of the adjusting signal SD2 inputted to the multiplexer 25 of FIG. 2.

An example of the PLL circuit 20 of FIG. 2 includes a charge pump 201 electrically connected to the second multiplexer 25, a loop filter 202 electrically connected to the charge pump 201 and a voltage controlled oscillator 203 electrically connected to the loop filter 202, the phase/frequency detector 21, the data frequency detector 22 and the phase detector 23, which can be implemented with conventional designs and is not intended to be described in details herein.

Figure 7:
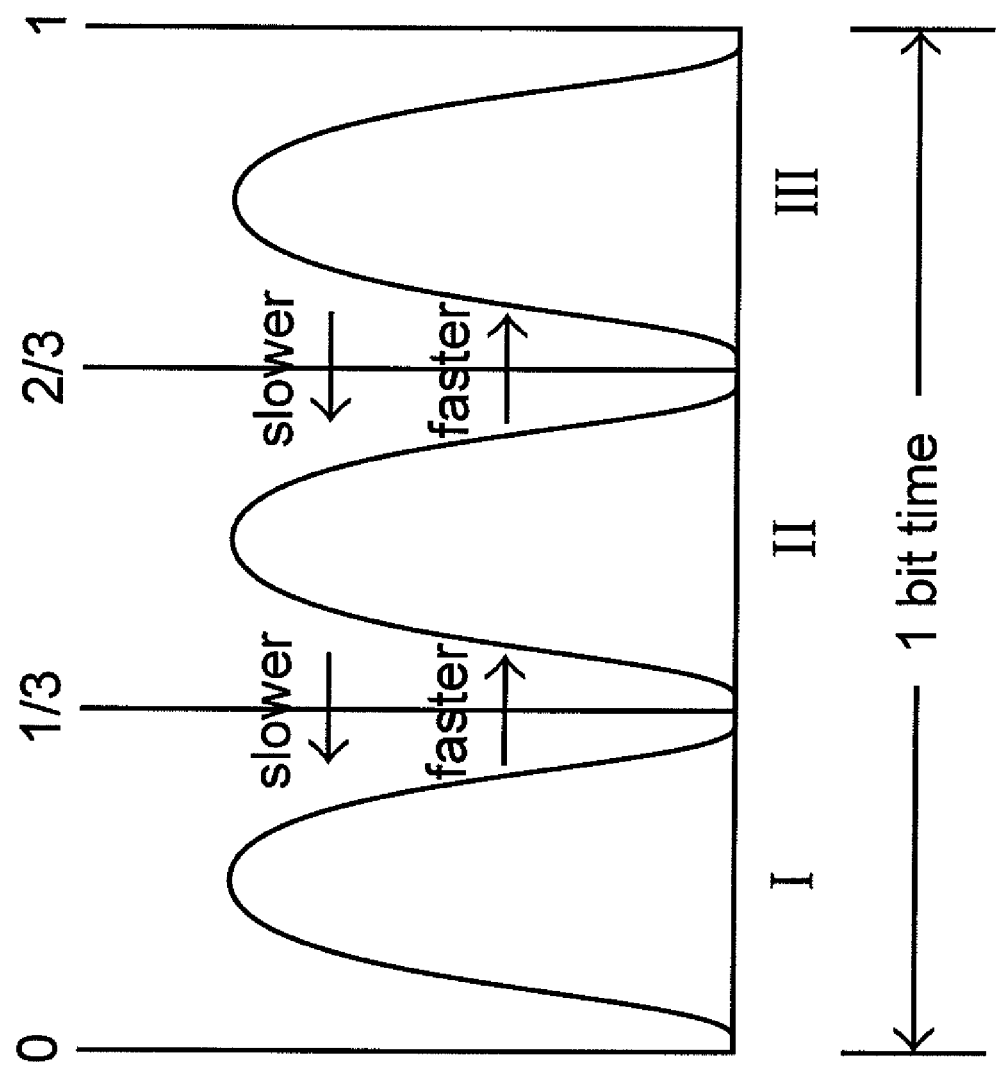
FIG. 7 is a waveform diagram illustrating possible distributions and variations of data transition timing resulting from a third embodiment of a clock-adjusting method according to the invention.

A clock adjusting method according to a further embodiment of the present invention is illustrated hereinafter with reference to FIG. 7. In this method, a triple frequency sampling is performed on the serial input data Rdata, i.e. sampling the data Rdata with trice frequency of the clock signal Ck, thereby realizing possible distribution of data transition timing as shown in FIG. 7. For facilitating the analysis, a unitary bit time of the serial input data Rdata is divided into three zones, and the data transition waveform obtained by sampling with triple frequency is supposed to be located in Zone I instead of Zone II and Zone III. However, when there is frequency difference existing between the serial input data Rdata and the clock signal Ck, the waveform will shift, either leftwards or rightwards. Accordingly, whether there is frequency difference between the serial input data Rdata and the clock signal Ck can be determined by observing whether there is waveform shift occurring, and which of the serial input data Rdata and the clock signal Ck has a higher frequency can be determined by observing the shift direction of the data transition waveform. For example, if the waveform shifts rightwards, i.e. from Zone I to Zone II, from Zone II to Zone III, or from Zone III to Zone I, it is indicated that the serial input data Rdata is slower than the clock signal Ck. That is, the frequency of the serial input data Rdata is lower than that of the clock signal Ck. On the contrary, if the waveform shifts leftwards, i.e. from Zone III to Zone II, from Zone II to Zone I, or from Zone I to Zone III, it is indicated that the serial input data Rdata is faster than the clock signal Ck. That is, the frequency of the serial input data Rdata is higher than that of the clock signal Ck.

Figure 8:
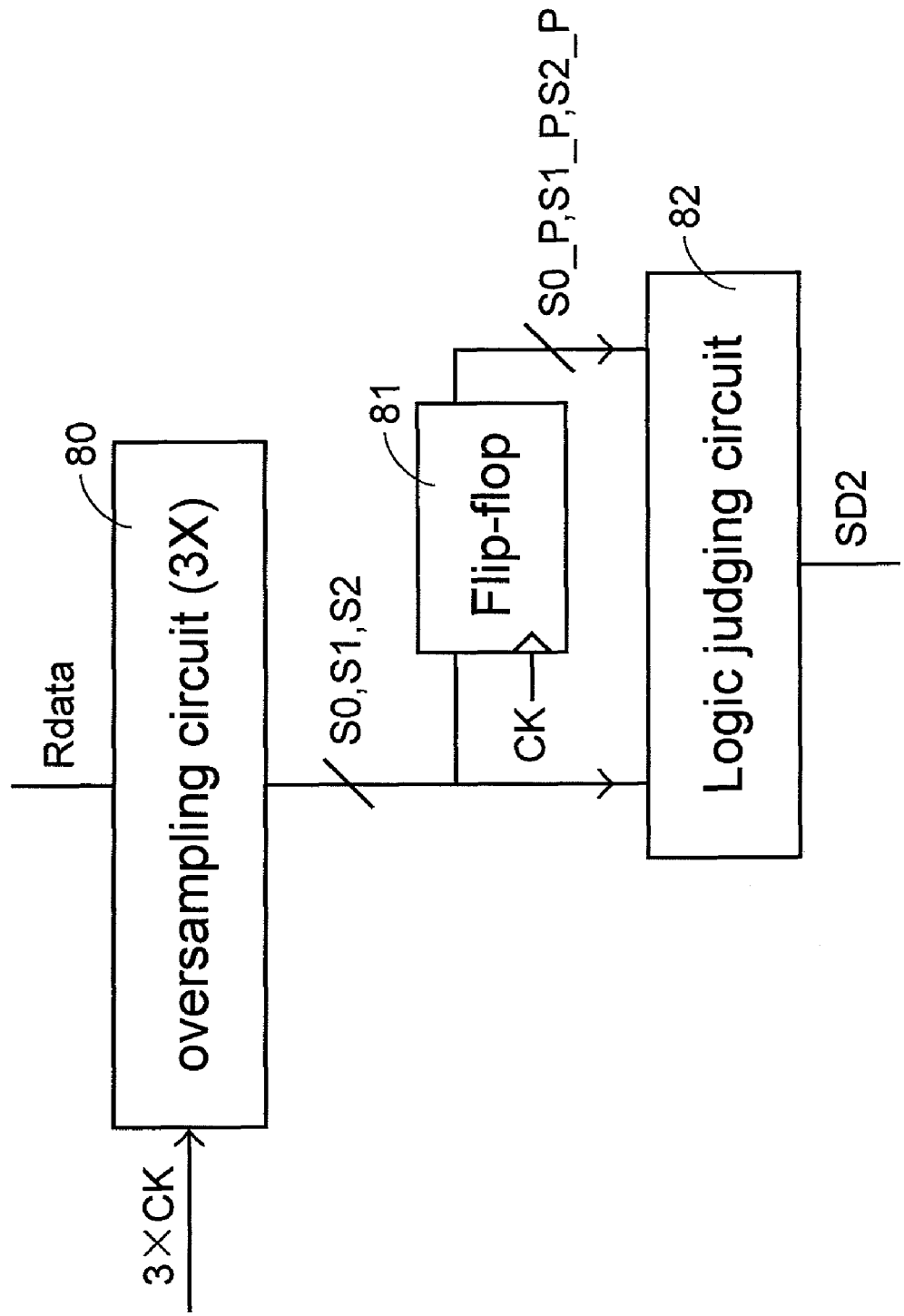
FIG. 8 is a functional block diagram illustrating another embodiment of data frequency detector for use in the clock-signal adjusting device of FIG. 2 to implement the clock-signal adjusting method of FIG. 7.

For implementing the above clock adjusting method, an embodiment of data frequency detector 22 is provided as shown in FIG. 8. The data frequency detector 22 includes an oversampling circuit 80, a flip-flop 81 and a logic judging circuit 82. The oversampling circuit 80 receives and samples the serial input R data with a sampling frequency trice that of the clock signal Ck to obtain a data transition waveform in response to a series of sampling data points. When the data transition waveform is located in Zone I, a signal S0 is outputted with logic "1" by the oversampling circuit 80. A signal S1 is outputted with logic "1" when the data transition waveform is located in Zone II, and the signal S1 is outputted with logic "0" when the data transition waveform is not located in Zone II. A signal S2 is outputted with logic "1" when the data transition waveform is located in Zone III, and the signal S2 is outputted with logic "0" when the data transition waveform is not located in Zone III. The flip-flop 81 receives and delays the signals S0, S1 and S2 with one cycle of the clock signal Ck. Then, delayed signals S0_p, S1_p and S2_p are outputted by the flip-flop 81 and transmitted to the logic judging circuit 82. According to the input signals S0, S1 and S2 and output signals S0_p, S1_p and S2_p of the flip-flop 81, the second adjusting signal SD2 is outputted by the logic judging circuit 82 to the multiplexer 25 (FIG. 2). A truth table of the output SD2 of the logic judging circuit 82 is shown in Table 3.

TABLE 3

| S0_p | S1_p | S2_p | S0 | S1 | S2 | SD2 |
|---|---|---|---|---|---|---|
| 1 | 0 | 0 | 0 | 1 | 0 | 0 |
| 0 | 1 | 0 | 0 | 0 | 1 | 0 |
| 0 | 0 | 1 | 1 | 0 | 0 | 0 |
| 1 | 0 | 0 | 0 | 0 | 1 | 1 |
| 0 | 1 | 0 | 1 | 0 | 0 | 1 |
| 0 | 0 | 1 | 0 | 1 | 0 | 1 |

The first to third rows of Table 3 all indicate the rightward shift of the data transition waveform, and the adjusting signal SD2 outputted by the logic judging circuit 82 is at logic "0", indicating the frequency of the serial input data Rdata is less than that of the clock signal Ck. On the contrary, the fourth to the sixth rows of Table 3 all indicate the leftward shift of the data transition waveform, and the adjusting signal SD2 outputted by the logic judging circuit 82 is at logic "1", indicating the frequency of the serial input data Rdata is higher than that of the clock signal Ck.

To sum up, all of the above-mentioned embodiments of the invention can effectively detect the frequency difference between the serial input data Rdata and the clock signal Ck, and thus solve the problems of the prior art and achieve the objective of the invention. Of course, in addition to the above-mentioned 2× and 3× oversampling, the data can be sampled with higher sampling frequency to achieve the similar purpose. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A clock-signal adjusting method performed by a CDR (clock data recovery) circuit for adjusting a frequency of a clock signal according to a frequency of an input data, comprising steps of:
    sampling the input data with a sampling frequency m times of the clock frequency to obtain a data transition waveform indicating data transition timing distribution, wherein m is greater than one;
    dividing a unitary bit time of the input data into m zones;
    deriving a delayed data transition waveform from the data transition waveform;
    determining a frequency relationship between the clock signal and the input data according to distributions of the data transition waveform and the delayed data transition waveform in the zones; and
    adjusting the frequency of the clock signal according to the frequency relationship.

2. The method according to claim 1 wherein the distributions of the data transition waveform and the delayed data transition waveform in the zones include a shift of the data transition waveform or a shift of the delayed data transition waveform relative to the zones on a time coordinate.

3. The method according to claim 2 wherein the frequency relationship indicates that the frequency of the clock signal is less than that of the input data when the distributions of the data transition waveform and the delayed data transition waveform in the zones are on a first condition, and the frequency relationship indicates that the frequency of the clock signal is higher than that of the input data when the distributions of the data transition waveform and the delayed data transition waveform in the zones are on a second condition different from the first condition.

4. The method according to claim 3 wherein the frequency of the clock signal is increased when the frequency relationship indicates that the frequency of the clock signal is less than that of the input data, and the frequency of the clock signal is reduced when the frequency relationship indicates that the frequency of the clock signal is higher than that of the input data.

5. The method according to claim 2, further comprising a step of:
    sampling the delayed data transition waveform with the sampling frequency;
    wherein the frequency relationship between the clock signal and the input data is determined according to the shift of the data transition waveform and the shift of the delayed data transition waveform relative to the zones.

6. The method according to claim 1, wherein the delay of the data transition waveform is delayed for a predetermined period shorter than the unitary bit time.

7. The method according to claim 1 wherein m is substantially equal to two.

8. The method according to claim 1 wherein m is substantially equal to three.

9. A clock-signal adjusting device for adjusting a frequency of a clock signal according to a frequency of an input data, comprising:
- a first oversampling circuit for receiving and sampling the input data with a sampling frequency m times of the frequency of the clock signal, where m is greater than one, to obtain a first data transition waveform indicating a first data transition timing distribution;
- a first flip-flop coupled to the first oversampling circuit for receiving and sampling the first data transition waveform with the frequency of the clock signal; and
- a logic judging circuit coupled to the first flip-flop for determining a first shift of the first data transition waveform before and after passing through the first flip-flop, and outputting a control signal for adjusting the frequency of the clock signal according to the first shift.

10. The device according to claim 9 wherein the frequency of the clock signal is increased in response to the control signal when the first shift is a leftward shift, and the frequency of the clock signal is decreased in response to the control signal when the first shift is a rightward shift.

11. The device according to claim 10 wherein m is substantially equal to two, and a unitary bit time of the input data is divided into first and second zones for defining the first shift by detecting whether the data transition waveform shifts rightwards from the first zone to the second zone or shifts leftwards from the second zone to the first zone.

12. The device according to claim 11 further comprising:
- a delay unit for receiving and delaying the input data for a predetermined period;
- a second oversampling circuit coupled to the delay unit for receiving and sampling the delay input data with the sampling frequency m times the frequency of the clock signal to obtain a second data transition waveform indicating a second data transition distribution; and
- a second flip-flop coupled to the second oversampling circuit for receiving and sampling the second data transition waveform with the frequency of the clock signal.

13. The device according to claim 12 wherein the logic judging circuit is further coupled to the second flip-flop for determining a second shift of the second data transition waveform according to the input and output of the second flip-flop, and outputs the control signal for adjusting the frequency of the clock signal according to the first shift and the second shift.

14. The device according to claim 12 wherein the predetermined period is shorter than the unitary bit time.

15. The device according to claim 10 wherein m is substantially equal to three, and a unitary bit time of the input data is divided into first, second and third zones for defining the first shift by detecting whether the data transition waveform shifts rightwards from the first zone to the second zone, from the second zone to the third zone or from the third zone to the first zone, or shifts leftwards from the third zone to the second zone, from the second zone to the first zone, or from the first zone to the third zone.

16. The device according to claim 10 wherein the logic judging circuit outputs the control signal further according to a truth table.

17. A clock-signal adjusting device for adjusting a clock signal according to an input data and a reference clock signal, comprising:
- a phase lock loop body outputting the clock signal;
- a phase/frequency detector coupled to the phase locked loop circuit, and issuing a first adjusting signal according to a frequency difference between the reference clock signal and the clock signal;
- a data frequency detector coupled to the phase locked loop circuit, and issuing a second adjusting signal according to a frequency difference of the input data and the clock signal;
- a phase detector coupled to the phase locked loop circuit, and issuing a third adjusting signal according to a phase difference of the input data and the clock signal;
- a first multiplexer coupled to the phase/frequency detector and the phase detector to select one of the first adjusting signal and the third adjusting signal to be outputted; and
- a second multiplexer coupled to the first multiplexer and the data frequency detector to select one of an output of the first multiplexer and the second adjusting signal to be outputted to the phase locked loop circuit for adjusting and then outputting the clock signal.

18. The device according to claim 17 wherein the phase locked loop circuit includes:
- a charge pump coupled to the second multiplexer;
- a loop filter coupled to the charge pump; and
- a voltage controlled oscillator coupled to the loop filter, the phase/frequency detector, the data frequency detector, and the phase detector for adjusting the frequency of the clock signal according to an output of the loop filter.

19. The device according to claim 17 wherein the data frequency detector includes:
- a first oversampling circuit for receiving and sampling the input data with a sampling frequency m times of the frequency of the clock signal to obtain a first data transition waveform indicating a first data transition timing distribution, wherein m is greater than one;
- a first flip-flop coupled to the first oversampling circuit for receiving and sampling the first data transition waveform with the frequency of the clock signal; and
- a logic judging circuit coupled to the first flip-flop for determining a first shift of the first data transition waveform according to the input and output of the first flip-flop, and outputting a control signal for adjusting the frequency of the clock signal according to the first shift.

20. The device according to claim 19 further comprising:
- a delay unit for receiving and delaying the input data for a predetermined period;
- a second oversampling circuit coupled to the delay unit for receiving and sampling the delay input data with the sampling frequency m times the frequency of the clock signal to obtain a second data transition waveform indicating a second data transition distribution; and
- a second flip-flop coupled to the second oversampling circuit for receiving and sampling the second data transition waveform with the frequency of the clock signal, wherein the logic judging circuit is further coupled to the second flip-flop for determining a second shift of the second data transition waveform according to the input and output of the second flip-flop, and outputs the control signal for adjusting the frequency of the clock signal according to the first shift, the second shift and a truth table.

* * * * *